United States Patent
Vasudev et al.

(10) Patent No.: US 10,895,612 B2
(45) Date of Patent: Jan. 19, 2021

(54) TEST AND MEASUREMENT INSTRUMENT WITH A HYSTERESIS LOOP MASK

(71) Applicant: Tektronix, Inc., Beaverton, OR (US)

(72) Inventors: U N Vasudev, Bengaluru (IN); Gajendra Kumar Patro, Bengaluru (IN); Krishna N H Sri, Bengaluru (IN)

(73) Assignee: Tektronix, Inc., Beaverton, OR (US)

( * ) Notice: Subject to any disclaimer, the term of this patent is extended or adjusted under 35 U.S.C. 154(b) by 32 days.

(21) Appl. No.: 16/160,879

(22) Filed: Oct. 15, 2018

(65) Prior Publication Data
US 2020/0116805 A1  Apr. 16, 2020

(51) Int. Cl.
*G01R 33/14* (2006.01)

(52) U.S. Cl.
CPC .................... *G01R 33/14* (2013.01)

(58) Field of Classification Search
CPC ...................................... G01R 33/14
USPC .......................................... 324/223
See application file for complete search history.

(56) References Cited

U.S. PATENT DOCUMENTS

| | | | | |
|---|---|---|---|---|
| 2,651,105 A * | 9/1953 | Neel | ........... | H01F 1/065 29/608 |
| 2,795,753 A * | 6/1957 | House | ........... | H03F 9/06 323/329 |
| 2,931,022 A * | 3/1960 | Triest | ........... | H03M 1/00 345/13 |
| 2,933,653 A * | 4/1960 | Carter | ........... | F42D 1/05 361/248 |
| 2,934,696 A * | 4/1960 | Williams | ........... | G01R 33/14 324/211 |
| 2,941,090 A * | 6/1960 | Lo | ........... | G11C 11/06007 307/422 |
| 2,970,690 A * | 2/1961 | Werner | ........... | B07C 5/344 209/568 |
| 2,998,564 A * | 8/1961 | Lawrence, Jr. | ........... | G05F 1/32 323/329 |
| 3,040,184 A * | 6/1962 | Dillon, Jr. | ........... | H03C 1/10 307/401 |
| 3,040,246 A * | 6/1962 | Lundin | ........... | G01R 33/14 324/222 |
| 3,060,418 A * | 10/1962 | Werner | ........... | G11C 11/06007 365/201 |
| 3,093,817 A * | 6/1963 | Lo | ........... | H03K 17/82 365/144 |
| 3,164,496 A * | 1/1965 | Hibbard, Jr. | ........... | C21D 8/1205 148/120 |

(Continued)

*Primary Examiner* — Christopher P McAndrew
(74) *Attorney, Agent, or Firm* — Miller Nash Graham & Dunn; Andrew J. Harrington (57) ABSTRACT

A test and measurement instrument, comprising at least one port configured to receive a signal from a device under test; a user interface configured to receive a user input, the user input indicating magnetic properties of a magnetic material of the device under test, and one or more processors. The one or more processors are configured to generate a hysteresis loop mask based on the magnetic properties of the magnetic material, determine whether the signal received from the device under test violates the hysteresis loop mask, and generate an alert when the signal received from the device under test violates the hysteresis loop mask. The test and measurement instrument may also include a display configured to display the hysteresis loop mask, the signal received from the device under test, and/or the alert.

21 Claims, 6 Drawing Sheets

(56) References Cited

U.S. PATENT DOCUMENTS

| | | | | |
|---|---|---|---|---|
| 3,302,190 | A * | 1/1967 | Boylan | G11C 17/02 365/97 |
| 3,355,724 | A * | 11/1967 | Brownell | H01F 1/0304 365/136 |
| 3,422,407 | A * | 1/1969 | Wenny, Jr. | H01F 1/0304 365/136 |
| 3,592,964 | A * | 7/1971 | Waring, Jr. | H04N 5/7805 360/114.07 |
| 3,713,069 | A * | 1/1973 | Hini | H03K 3/02 338/32 R |
| 3,738,818 | A * | 6/1973 | Stone et al. | G11B 5/656 428/579 |
| 4,546,060 | A * | 10/1985 | Miskinis | G03G 9/107 148/108 |
| 4,623,841 | A * | 11/1986 | Stinson | G01R 33/14 324/211 |
| 9,259,492 | B2 * | 2/2016 | Krishnan | A61K 9/14 |
| 9,555,136 | B2 * | 1/2017 | Khandhar | A61B 5/0515 |
| 10,345,398 | B1 * | 7/2019 | Zhou | G01R 33/14 |
| 2002/0157478 | A1 * | 10/2002 | Seale | G01N 3/00 73/789 |
| 2005/0184736 | A1 * | 8/2005 | Ramesh | G01R 33/14 324/522 |
| 2007/0187513 | A1 * | 8/2007 | Marin Palacios | G01R 33/14 235/462.37 |
| 2013/0057271 | A1 * | 3/2013 | Garshelis | G01R 33/123 324/251 |
| 2014/0097704 | A1 * | 4/2014 | Cavallera | H02H 9/002 307/125 |
| 2015/0094973 | A1 * | 4/2015 | Iwanusiw | G01R 33/14 702/65 |
| 2015/0168502 | A1 * | 6/2015 | Furuya | G06F 30/20 703/2 |
| 2017/0016967 | A1 * | 1/2017 | Hull | H05B 6/105 |

\* cited by examiner

TEST AND MEASUREMENT INSTRUMENT WITH A HYSTERESIS LOOP MASK

TECHNICAL FIELD

This disclosure is directed to systems and methods related to test and measurement systems, and in particular, to hysteresis loop measurement of a magnetic core of a device under test by a test and measurement instrument.

BACKGROUND

Many electronic circuits use components that have magnetic cores, such as transformers or inductors. An important part of magnetic core design is the flux density (B) and magnetic field strength (H) curves, also known as a B-H curve or a hysteresis loop. The B-H curve characterizes the magnetic core and can give an insight of the expected behavior of the magnetic core during in-circuit operations. The expected behavior of the magnetic core may be critical for the stable operation of some electronic circuits, such as switched-mode power supply (SMPS) circuits.

However, magnetic cores sometimes do not behave as expected which can result in the electronic circuits not working correctly or efficiently. A user has no way of knowing whether it is the magnetic core causing this problem or another component of the circuit.

Embodiments of the disclosure address these and other deficiencies of the prior art.

BRIEF DESCRIPTION OF THE DRAWINGS

Aspects, features and advantages of embodiments of the present disclosure will become apparent from the following description of embodiments in reference to the appended drawings in which.

DESCRIPTION

Stability of a magnetic core can be crucial for electronic circuit design, and the stability of the magnetic core may vary based on environment, such as with temperature, or based on various properties of the core itself. The B-H curve, as mentioned above, is the expected characteristic of the magnetic material during operation of an electronic circuit. The B-H curve includes a remanence flux density (Br) value, a coercive force (Hc) value, and a saturation flux density (Bs) value. The Br value is also known as residual induction that remains in the magnetic material of the magnetic core after an externally applied magnetic field (H) has returned to zero.

A magnetic material used for the magnetic core dictates the magnetizing property suitable for specific electrical applications. For example, soft ferromagnetic materials, such as iron or silicon steel, have very narrow magnetic hysteresis loops, resulting in small amounts of residual magnetism. The properties of low remanence can make soft ferromagnetic materials suitable for relays, solenoids, and transformers, as they can be easily magnetized and demagnetized.

For wireless charging, such as for cell phones or inductive charging of electric vehicles, ensuring magnetic cores of a magnetic component are in a stable region of operation under all conditions is critical for design efficiency. Embodiments of the disclosure allow a user to measure the B-H curve for these devices under test that have magnetic cores under a variety of conditions and allow a user to be able to determine design efficiency.

Disclosed herein is a test and measurement instrument that can generate a hysteresis loop mask based on the magnetic properties of the magnetic material, determine whether a signal received from a device under test violates the hysteresis loop mask, and generate an alert when the signal received from the device under test violates the hysteresis loop mask. The test and measurement instrument may also include a display configured to display the hysteresis loop mask, the signal received from the device under test, and/or the alert so a user may readily view which particular hysteresis loop cycle of the hysteresis loop violated the hysteresis loop mask. As mentioned above, this process is advantageous and a new ability for a user to determine more precisely the efficiency of their circuit design, and specifically allows the user to test the magnetic properties used in such circuits.

Figure 1:
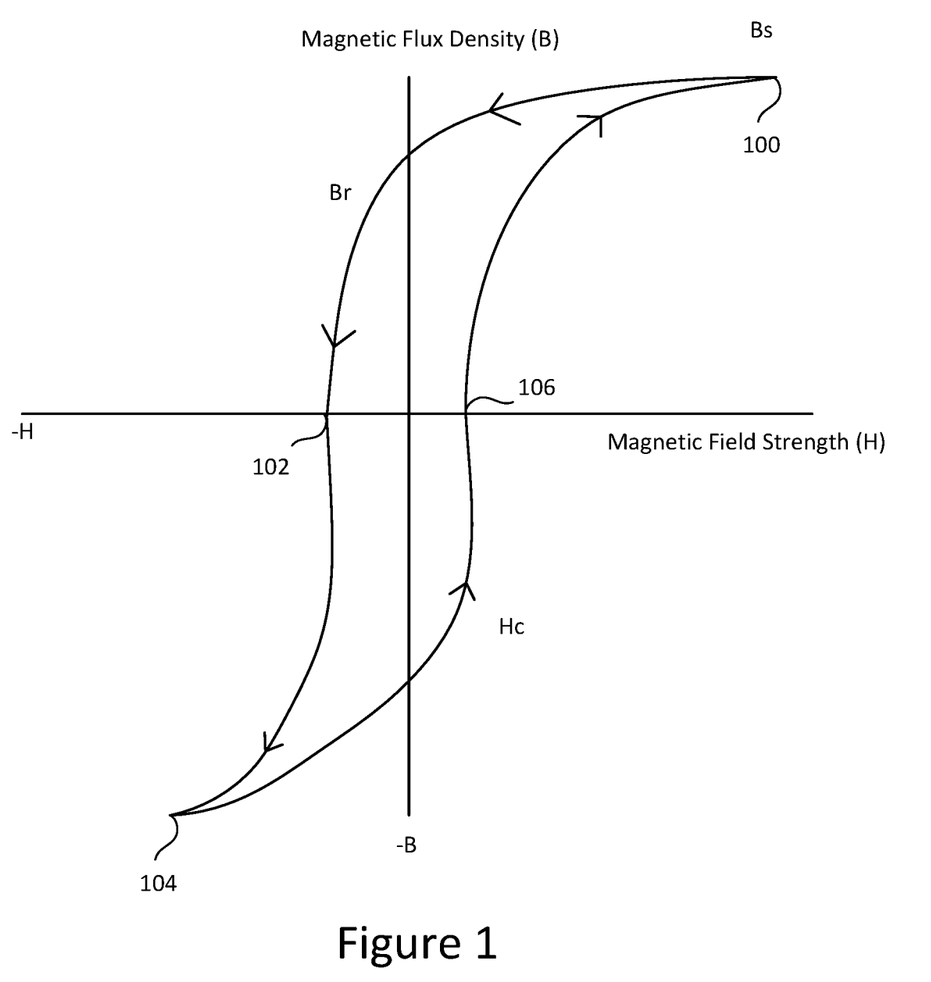
FIG. 1 is an example hysteresis loop of a magnetic material.

FIG. 1 illustrates an example ideal B-H curve for a magnetic material. As discussed above, the B-H curve illustrates the effect of magnetic saturation. In particular, the B-H curve of FIG. 1 illustrates the effect of applying an external magnetic field to unmagnetized iron. The magnetism curve starts at the origin point of reference point 106 and increases as the magnetic field strength increases, magnetizing the iron, toward reference point 100, as shown by the arrows. As the magnetic field is reversed, the iron eventually becomes magnetized in the reverse direction, passing through reference point 102, until it again saturates at reference point 104. A stable magnetic core means a B-H curve will trace the flow of reference points 100, 102, 104, and 106 marked on FIG. 1 relatively consistently for every cycle of operation.

B-H curves are different for various magnetic cores based on air, iron, and copper properties. Magnetic saturation points are also different for various cores. Further, there is a limit to the amount of flux density (B) that can be generated by the magnetic core and any further increase in a magnetic field strength (H) will have no effect. This is referred to as the saturation point (Bs).

As will be discussed in more detail below, a hysteresis loop mask can be defined using the flux density (B) and magnetic field strength (H). For ferromagnetic materials, the ratio of flux density (B) to magnetic field strength (H) is not constant but varies with the flux density (B). This is known as permeability, which is the ratio of B and H calculated on the worst case (Bpeak) of a hysteresis loop cycle. However, for air cored coils or any non-magnetic medium cores, such as woods or plastics, permeability can be considered as a constant, i.e., such materials retain no magnetic remanence, and for free space the value is $4\pi \times 10^7$ H/m. As such, the center opening of the B-H curve varies for different magnetic materials. Embodiments of the disclosure can define a hysteresis loop mask on a test and measurement instrument, as discussed in more detail below, and monitor whether a hysteresis loop is traced properly to not encroach on the defined mask.

Figure 2:
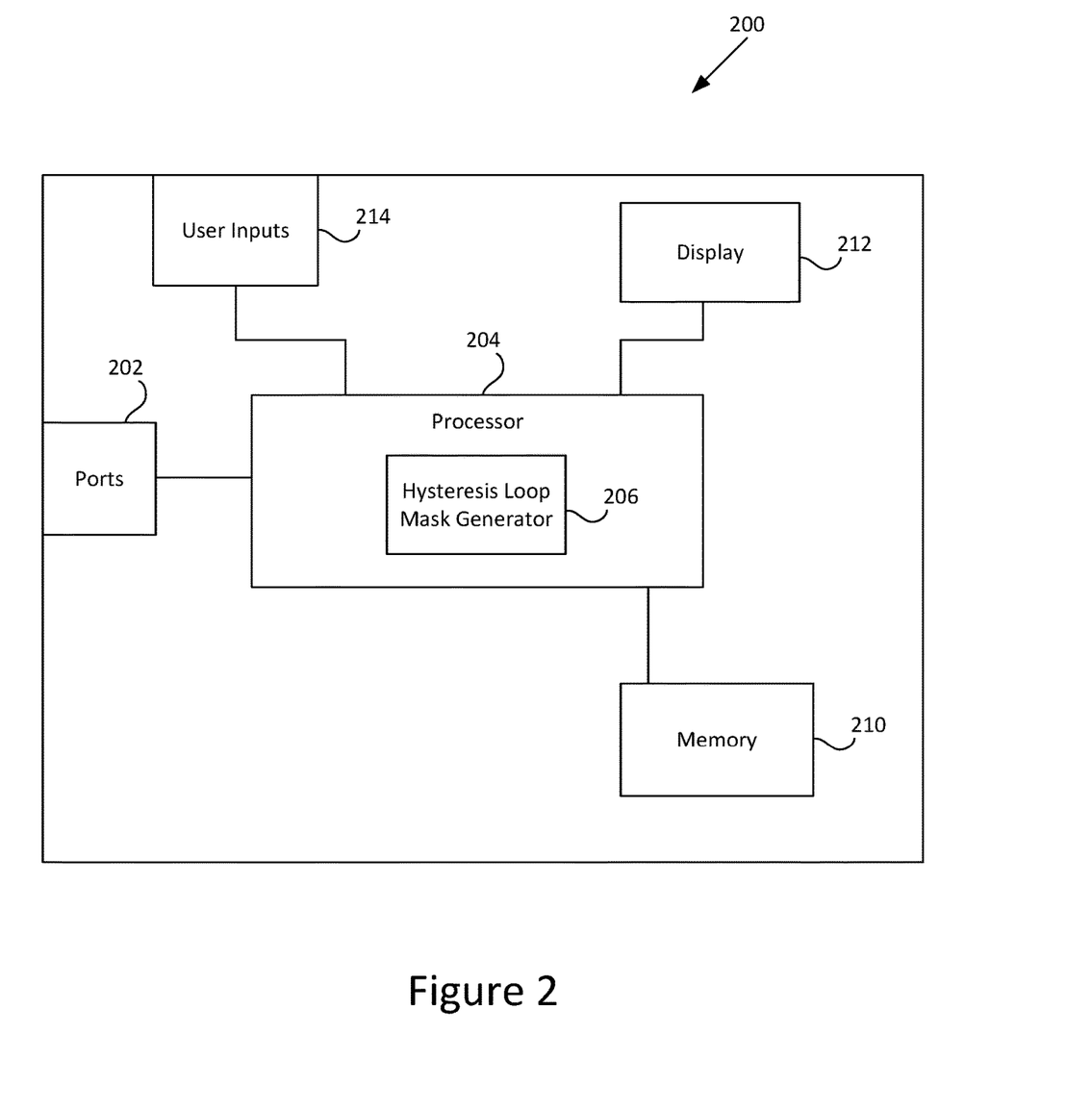
FIG. 2 is a block diagram of an example test and measurement instrument according to some embodiments of the disclosure.

FIG. 2 is a schematic block diagram of an example test instrument 200, such as an oscilloscope, for implementing embodiments of the technology disclosed herein. The instrument 200 includes a number of ports 202, which may be any electrical signaling medium. Ports 202 may include receivers, transmitters, and/or transceivers, for example. One or more of the ports 202 may be connected to a device under test to receive a signal from the magnetic core of the device under test. The electrical signal from the device under test may include, for example, a current and/or voltage measured across the magnetic core of a magnetic component of the device under test.

The ports 202 are coupled with a processor 204, which may either include a measurement unit or may connect to a measurement unit. Such a measurement unit can include any component capable of measuring aspects (e.g., voltage, amperage, amplitude, etc.) of a signal received via ports 202. The processor 204 can include a hysteresis loop mask generator 206, which will be discussed in more detail below, which may determine a hysteresis loop for the magnetic core based on the current and/or voltage measured across the magnetic core. The connection depicted from ports 202 to processor 204 can include conditioning circuits, an analog to digital converter, and/or other circuitry to convert a received signal to a waveform for further analysis. The resulting waveform or parameters thereof can then be stored in a memory 210.

The processor 204, may be implemented as any processing circuitry, such as an application specific integrated circuit (ASIC), a digital signal processor (DSP), a field programmable gate array (FPGA), etc. The processor 204 is configured to execute instructions from memory 210 and may perform any methods and/or associated steps indicated by such instructions. Memory 210 may be implemented as processor cache, random access memory (RAM), read only memory (ROM), solid state memory, hard disk drive(s), and/or any other memory type. Memory 210 acts as a medium for storing data, computer program products, and other instructions, and providing such data/products/instructions to the processor 204 for computation as desired. Memory 210 also stores, for example, information or commands received from user inputs 214 for use by the processor 204.

User inputs 214 are coupled to the processor 204. User inputs 214 may include a keyboard, mouse, trackball, touchscreen, and/or any other controls employable by a user to interact with a graphic user interface (GUI) on a display 212. The display 212 may be a digital screen, a cathode ray tube based display, or any other monitor to display test results to a user as discussed herein. While the components of test instrument 200 are depicted as being integrated within test instrument 200, it will be appreciated by a person of ordinary skill in the art that any of these components can be external to test instrument 200 and can be coupled to test instrument 200 in any conventional manner (e.g., wired and/or wireless communication media and/or mechanisms).

The hysteresis loop mask generator 206 on the processor 204 receives information from the user inputs 214 or memory 210 regarding the properties of the magnetic material that is being tested in the device under test. Based on the received information of the properties of the magnetic material, the hysteresis loop mask generator 206 generates a hysteresis loop mask. This hysteresis loop mask may be displayed on a GUI on the display 212. A user may further modify this hysteresis loop mask using the user inputs 214. Once a user is satisfied with the hysteresis loop mask, then a measurement of a magnetic core of a device under test can begin and the B-H curve for the device under test may be generated. That is, the processor 204 may use the current and/or voltage from the signal of the device under test to measure a B-H curve over a number of cycles. The measured B-H curve may be displayed on the display 212 with the hysteresis loop mask also displayed. If the measured B-H curve violates the hysteresis loop mask an alert signal may be generated by the processor 204 and output to the display 212.

The alert signal may be, for example, a text box that is displayed on the display 212 or may include highlighting the hysteresis loop cycle that violates the hysteresis loop mask. The alert signal may also be or may include, for example, an audible alert, or a color change of the display 212, such as coloring a portion of the display 212 red. The alert signal, however, is not limited to these examples, but may be any indicator that a signal from the device under test violated the hysteresis loop mask. In some embodiments, the alert signal may be a trigger signal that may be used to initiate an action by the test instrument 200, for example, triggering an acquisition of a signal into the memory 210 of the test instrument 200, or which may be output by the test instrument 200 to initiate an action by other external test instrumentation. A user may select the displayed alert signal to determine which portion of the signal from the device under test violated the hysteresis loop mask and determine what was happening at that point in the test, such as the signal from the device under test immediately before and/or after the violation, as well as other data that may be correlated to the violation, such as a temperature.

Using FIG. 1 as an example, the hysteresis loop mask generator 206 can generate a mask based on the magnetic properties of a magnetic material of the magnetic component of the device under test. A user may input into the user inputs 214 magnetic property information of the magnetic material of the magnetic core. This generation can be implemented by a user either inputting all the information into the user inputs 214, in which case, the user may obtain the information from a data sheet of the magnetic component of the device under test. Or, in other cases, default B-H curves may be saved in memory 210 and a user may select and/or modify one of the existing default B-H curves for a particular magnetic material. Or, in still other cases, the user may run a stand-alone or built-in measurement software application to measure the magnetic property information of the magnetic material of the magnetic core, and then that measured information may be input to test instrument 200 and used to either manually or automatically generate the mask.

Figure 3:
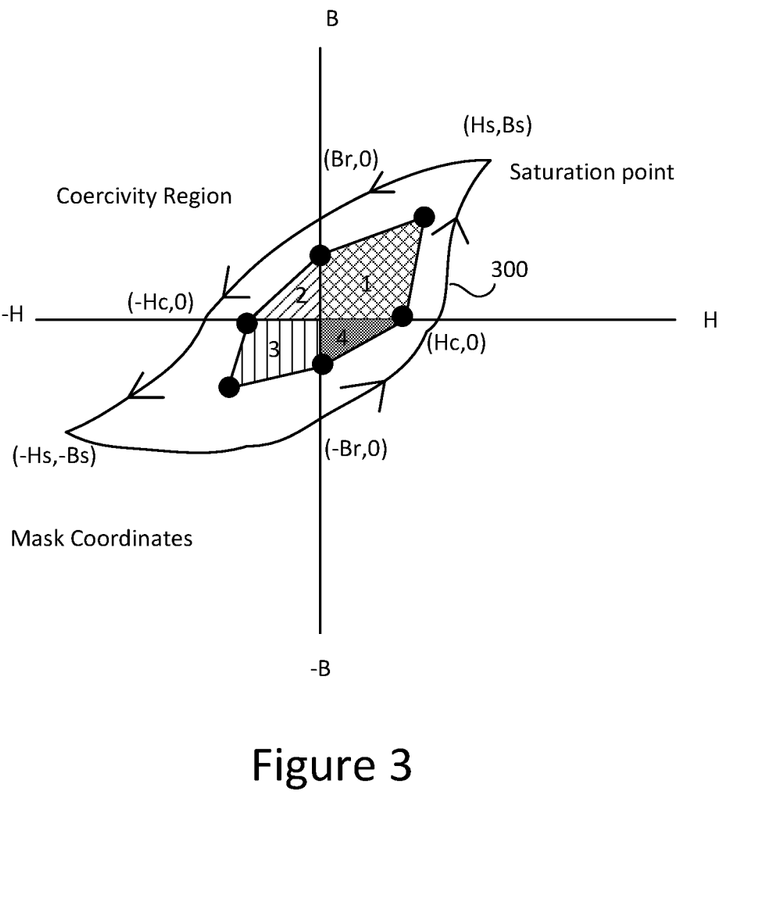
FIG. 3 is an example hysteresis loop mask generated according to embodiments of the disclosure.

FIG. 3 illustrates an example hysteresis loop mask generated by the hysteresis loop mask generator 206. The arrows shown on the hysteresis loop 300 indicate the direction of energy flow in the magnetic core and the magnetizing current that flows through a coil alternates between a positive and negative value.

The hysteresis loop mask may be defined by four different mask segments set in each quadrant of the hysteresis loop graph. As mentioned above, a user may input the magnetic properties of a magnetic material, including the positive and negative saturation levels of B and H (Bs, Hs), the positive and negative Br values, and the positive and negative Hc values, as marked on the graph of FIG. 3.

The hysteresis loop mask coordinates may be set at a predetermined percentage below these points. In other words, the hysteresis loop mask generator 206 receives the points and selects a corresponding hysteresis mask coordinate below each of the points based on a predetermined percentage. In some embodiments, the predetermined percentage may be saved in a memory, such as 20%, as shown in FIG. 3. The predetermined percentage at 20% may provide a sufficient tolerance range, or test margin, to minimize false failures, and matches the tolerance range on the data sheet for various materials. In other embodiments, a user may enter the percentage through the user inputs 214, which may then be used by the hysteresis loop mask generator 206 to determine or generate the hysteresis loop mask. As mentioned above, in some embodiments, if the signal from the device under test falls within the hysteresis loop mask, then the alert signal is generated. In other embodiments, which may be selected by the user in the user inputs 214, the alert signal may be generated when the signal from the device under test is outside the hysteresis loop mask. A user can select via the user inputs 214 which embodiments the user desires to use.

In FIG. 3, the four mask segments used to create the hysteresis loop mask are illustrated on the graph. In this example, the first mask segment is set at 20% below the entered positive saturation values of B and H, the positive Br value, and the positive Hc value. The first mask segment, labeled as 1, is defined by these values, as well as the origin of the graph. The second mask segment, labeled as 2, is defined by 20% below the positive Br value, the negative Hc value, and the origin. The third mask segment, labeled as 3, is defined by 20% below the negative Hc value, the negative saturation values B and H, the negative Br value, and the origin. Finally, the fourth mask segment, labeled as 4, is defined by 20% below the negative Br value, the positive Hc value, and the origin.

In other embodiments, the mask may be set by initially measuring the hysteresis loop of the magnetic core with the test instrument 200, and then the processor 204 sets the mask based on the measured hysteresis loop by setting the mask a predetermined percentage below the measured hysteresis loop. In still other embodiments, the mask may be set by graphically drawing the mask or mask segments on the display 212 through the user interface 214.

Figure 4:
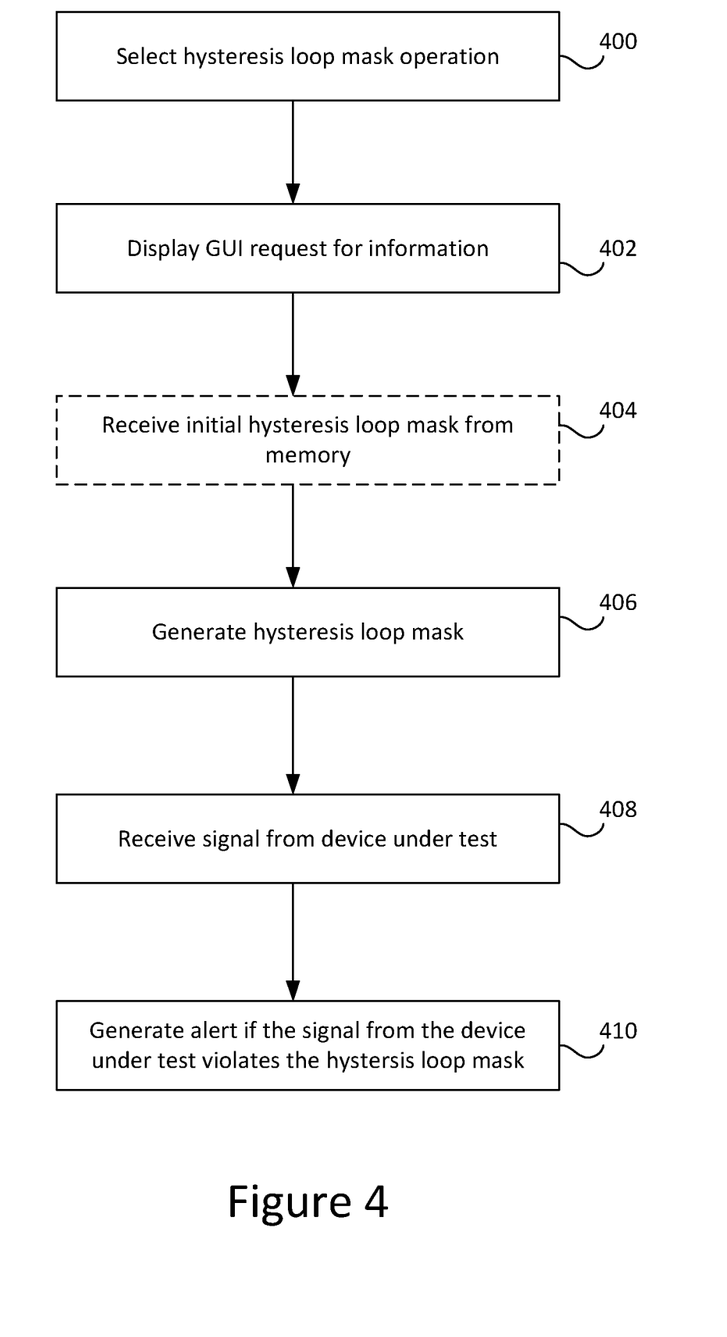
FIG. 4 is a flow chart illustrating an example operation of the test and measurement instrument according to embodiments of the disclosure.

FIG. 4 illustrates an operation of the test and measurement instrument 200 in FIG. 2 according to some embodiments. In operation 400, a user may select via the user interface for a hysteresis loop mask operation. In operation 402, a request for information is displayed via a GUI on the display 212 for the user to input information. The request for information may include, for example, a type of magnetic material, the magnetic properties of the magnetic material, and in some embodiments, a desired percentage at which to set a hysteresis loop mask.

In optional operation 404, the test and measurement instrument 200 may receive an initial hysteresis mask, which a user may modify through user inputs 214 and can be used to set the hysteresis loop mask, as discussed above.

In operation 406, the processor 204 generates the hysteresis loop mask based on the information received in operation 402 and the optional information received in operation 404. That is, the hysteresis loop mask is generated at a predetermined percentage under the expected hysteresis loop of the magnetic core material. In some embodiments, the hysteresis loop mask is displayed on the display 212.

In operation 408, a signal is received from a device under test at the ports 202 to measure the magnetic core of a component of the device under test. In some embodiments, additional information, such as a temperature, may be received with the signal from the device under test. The signal is displayed on the display 212, which may also be displayed with the hysteresis loop mask in some embodiments.

In operation 410, an alert signal is generated and displayed when the signal from the device under test violates the hysteresis loop mask. Generally, the alert signal is generated when a signal from the device under test falls within the hysteresis loop mask. However, in some embodiments, a user may desire for the signal from the device under test to only be within the hysteresis loop mask and the alert signal may be generated when the signal from the device under test falls outside the hysteresis loop mask.

Figure 5:
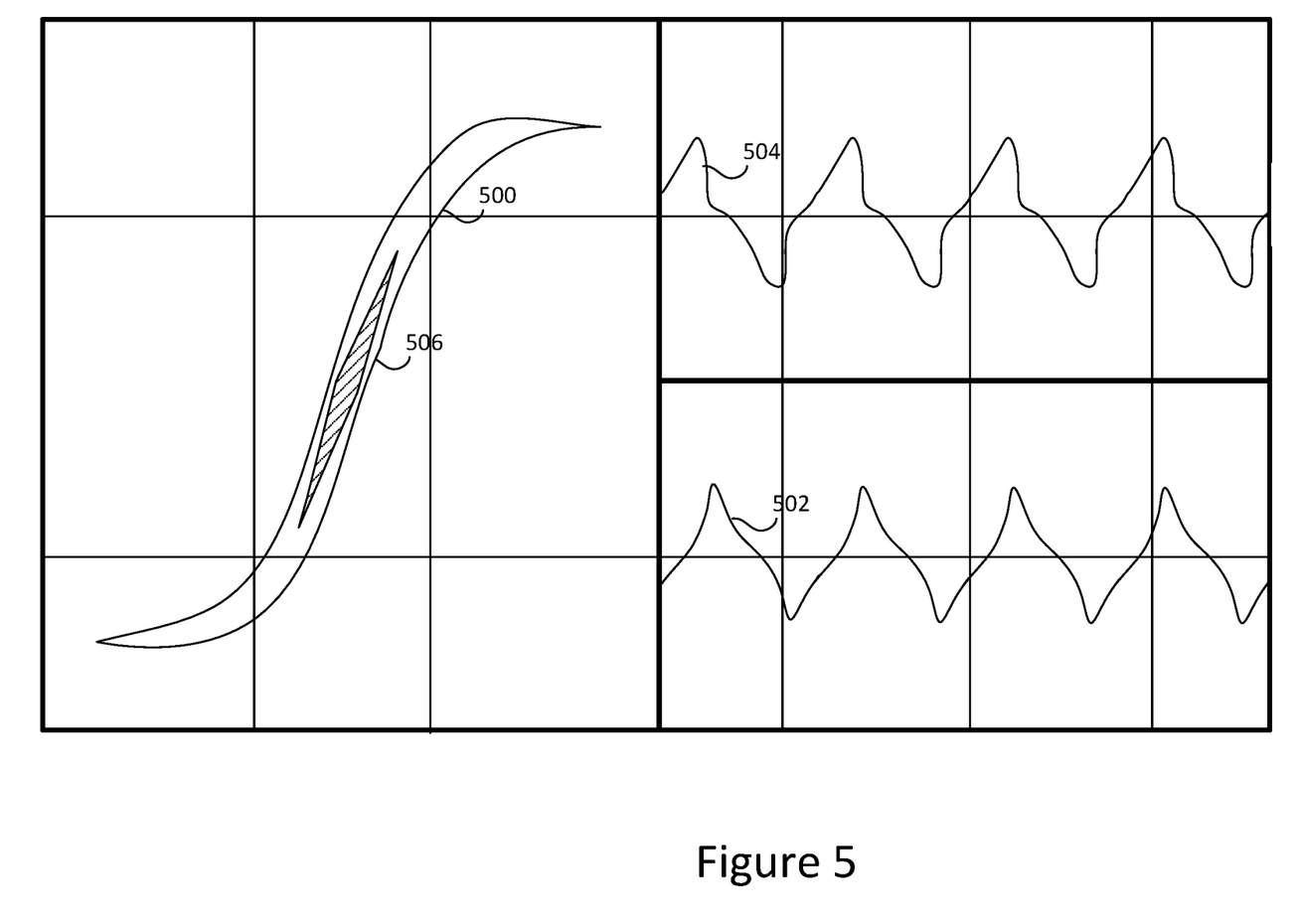
FIG. 5 is an example display output according to embodiments of disclosure.

FIG. 5 illustrates an example GUI of a display 212 of a test and measurement instrument 200 when testing a magnetic core of an inductor of a device under test. In this example, the signal from the device under test includes a current signal 502 and a voltage signal 504. The current signal 502 and the voltage signal 504 may be shown on the GUI to a user in a time domain.

The processor 204 generates a number of B-H curves 500 based on these signals. The hysteresis loop mask 506 generated by the hysteresis loop mask generator 206 is shown, as well. In FIG. 5, each of the B-H curves are outside of the hysteresis loop mask generator 206 and as can be seen in FIG. 5, these B-H curves 500 are generally all tracing the same hysteresis loop. If any of the signals 500 were to violate the hysteresis loop mask 506, the alert signal would be generated. The alert signal may include highlighting the B-H curve 500 that violates the hysteresis loop mask 506, or any other type of alert, such as a text box indicating one of the curves 500 violated the hysteresis loop mask 506.

Figure 6:
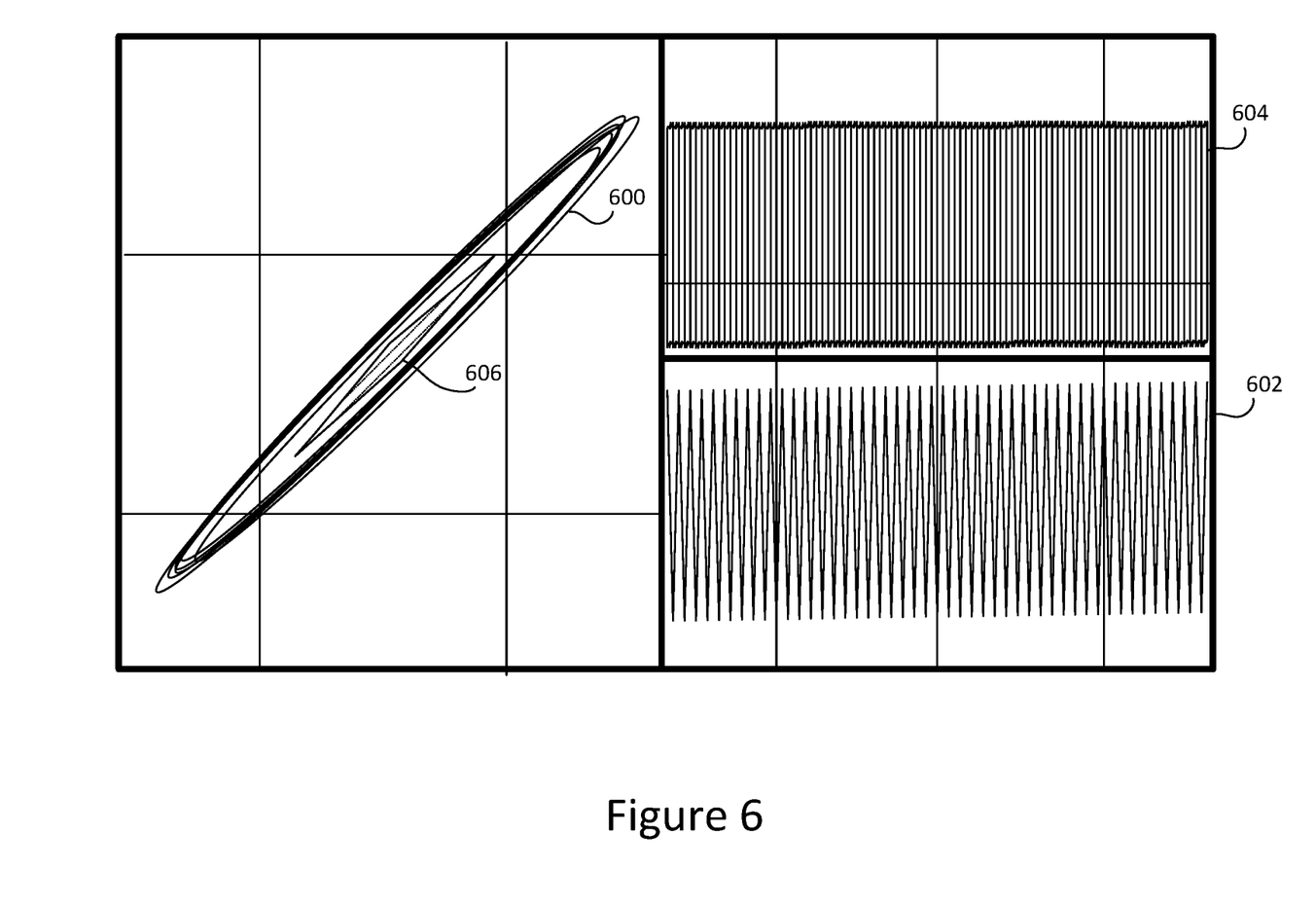
FIG. 6 is another example display output according to embodiments of the disclosure.

FIG. 6 illustrates an example GUI of a display 212 of a test and measurement instrument 200 when testing a magnetic core of a transformer of a device under test. In this example, the signal from the device under test includes a current signal 602 and a voltage signal 604, which may be shown to the user on the GUI in the time domain.

The processor 204 generates a number of B-H curves 600 based on these signals. As can be seen in FIG. 6, the B-H curves 600 are not as exact as the B-H curves 500 of FIG. 5. The hysteresis loop mask 606 generated by the hysteresis loop mask generator 206 is shown, as well. If any of the signals 600 were to violate the hysteresis loop mask 506, the alert signal would be generated.

Aspects of the disclosure may operate on particularly created hardware, firmware, digital signal processors, or on a specially programmed computer including a processor operating according to programmed instructions. The terms controller or processor as used herein are intended to include microprocessors, microcomputers, Application Specific Integrated Circuits (ASICs), and dedicated hardware controllers. One or more aspects of the disclosure may be embodied in computer-usable data and computer-executable instructions, such as in one or more program modules, executed by one or more computers (including monitoring modules), or other devices. Generally, program modules include routines, programs, objects, components, data structures, etc. that perform particular tasks or implement particular abstract data types when executed by a processor in a computer or other device. The computer executable instructions may be stored on a computer readable storage medium such as a hard disk, optical disk, removable storage media, solid state memory, Random Access Memory (RAM), etc. As will be appreciated by one of skill in the art, the functionality of the program modules may be combined or distributed as desired in various aspects. In addition, the functionality may be embodied in whole or in part in firmware or hardware equivalents such as integrated circuits, FPGA, and the like. Particular data structures may be used to more effectively implement one or more aspects of the disclosure, and such data structures are contemplated within the scope of computer executable instructions and computer-usable data described herein.

The disclosed aspects may be implemented, in some cases, in hardware, firmware, software, or any combination thereof. The disclosed aspects may also be implemented as instructions carried by or stored on one or more or computer-readable storage media, which may be read and executed by one or more processors. Such instructions may be referred to as a computer program product. Computer-readable media, as discussed herein, means any media that can be accessed by a computing device. By way of example, and not limitation, computer-readable media may comprise computer storage media and communication media.

Computer storage media means any medium that can be used to store computer-readable information. By way of example, and not limitation, computer storage media may include RAM, ROM, Electrically Erasable Programmable Read-Only Memory (EEPROM), flash memory or other memory technology, Compact Disc Read Only Memory (CD-ROM), Digital Video Disc (DVD), or other optical disk storage, magnetic cassettes, magnetic tape, magnetic disk storage or other magnetic storage devices, and any other volatile or nonvolatile, removable or non-removable media implemented in any technology. Computer storage media excludes signals per se and transitory forms of signal transmission.

Communication media means any media that can be used for the communication of computer-readable information. By way of example, and not limitation, communication media may include coaxial cables, fiber-optic cables, air, or any other media suitable for the communication of electrical, optical, Radio Frequency (RF), infrared, acoustic or other types of signals.

EXAMPLES

Illustrative examples of the technologies disclosed herein are provided below. An embodiment of the technologies may include any one or more, and any combination of, the examples described below.

Example 1 a test and measurement instrument, comprising at least one port configured to receive a signal from a device under test; a user interface configured to receive a user input, the user input indicating magnetic properties of a magnetic material of the device under test; one or more processors configured to generate a hysteresis loop mask based on the input magnetic properties of the magnetic material, determine whether the signal received from the device under test violates the hysteresis loop mask, and generate an alert when the signal received from the device under test violates the hysteresis loop mask; and a display configured to display at least one of the hysteresis loop mask, the signal received from the device under test, and the alert.

Example 2 is the test and measurement instrument of example 1, wherein the hysteresis loop mask is generated based on the magnetic properties by receiving the magnetic properties of the magnetic material and selecting coordinates of the hysteresis loop mask that provide a selected test margin from the magnetic properties.

Example 3 is the test and measurement instrument of example 2, wherein the selected test margin is 20% less than the magnetic properties.

Example 4 is the test and measurement instrument of any one of examples 1-3, wherein the hysteresis loop mask includes a mask segment based on positive saturation values of flux density (Bs) and magnetic field strength (Hs), a positive remanence flux density (Br) value, and a positive coercive force (Hc) value.

Example 5 is the test and measurement instrument of any one of examples 1-4, wherein the hysteresis loop mask includes a mask segment based on a positive remanence flux density (Br) value and a negative coercive force (−Hc) value.

Example 6 is the test and measurement instrument of any one of examples 1-5, wherein the hysteresis loop mask includes a mask segment based on the negative coercive force (−Hc) value, negative saturation values of flux density (−Bs) and magnetic field strength (−Hs), and a negative remanence flux density (−Br) value.

Example 7 is the test and measurement instrument of any one of examples 1-6, wherein the hysteresis loop mask includes a mask segment based on the negative remanence flux density (−Br) value and the positive coercive force (Hc) value.

Example 8 is the test and measurement instrument of any one of examples 1-7, wherein the user interface is further configured to receive a user input indicating a type of magnetic material for the magnetic properties and the one or more processors are further configured to store the generated hysteresis loop mask as a default hysteresis loop mask for the type of magnetic material indicated by the user input.

Example 9 is the test and measurement instrument of any one of examples 1-8, wherein the magnetic properties includes a type of magnetic material and the one or more processors generate the hysteresis loop mask by selecting a predetermined hysteresis loop mask stored in a memory that matches the type of magnetic material.

Example 10 is the test and measurement instrument of any one of examples 1-9, wherein the alert is selected from the group consisting of a text alert, an audible alert, a color change of the display, and a highlighted signal from the device under test that violates the hysteresis loop mask.

Example 11 is the test and measurement instrument of any one of examples 1-10, wherein the alert comprises a trigger signal.

Example 12 is a method for measuring a magnetic cord of a device under test, comprising receiving a signal from a device under test; receiving an input indicating magnetic properties of a magnetic material of the device under test; generating a hysteresis loop mask based on the magnetic properties of the magnetic material; determining whether the signal received from the device under test violates the hysteresis loop mask; generating an alert when the signal received from the device under test violates the hysteresis loop mask; and displaying on a display at least one of the hysteresis loop mask, the signal received from the device under test, and the alert.

Example 13 is the method of example 12, wherein generating the hysteresis loop mask based on the magnetic properties includes selecting coordinates of the hysteresis loop mask that are a predetermined percentage less than the magnetic properties.

Example 14 is the method of example 13, wherein the predetermined percentage is 20%.

Example 15 is the method of any one of examples 12-14, wherein the hysteresis loop mask is generated based on at least one of positive saturation values of flux density (Bs) and magnetic field strength (Hs), a positive remanence flux density (Br) value, a positive coercive force (Hc) value, a negative coercive force (−Hc) value, negative saturation values of flux density (−Bs) and magnetic field strength (−Hs), and a negative remanence flux density (−Br) value.

Example 16 is the method of example 15, wherein the hysteresis loop mask includes four separate masks, the first mask based on positive saturation values B and H, the positive Br value, and the positive Hc value, the second mask based on the positive Br value and the negative Hc value, the third mask based on the negative Hc value, negative saturation values of B and H, and the negative Br value, and the fourth mask based on the negative Br value and the positive Hc value.

Example 17 is the method of any one of examples 12-16, wherein the magnetic properties include a type of magnetic material, and the method further includes storing the generated hysteresis loop mask as a default hysteresis loop mask for the type of magnetic material indicated by the input.

Example 18 is the method of any one of examples 12-17, wherein the magnetic properties includes a type of magnetic material, and generating the hysteresis loop mask includes selecting a predetermined hysteresis loop mask stored in a memory that matches the type of magnetic material.

Example 19 is the method of any one of examples 12-18, wherein receiving an input indicating magnetic properties of a magnetic material of the device under test comprises receiving data from a software application that measures the magnetic properties of the magnetic material of the device under test.

Example 20 is the method of any one of examples 12-19, wherein the alert is selected from the group consisting of a text alert, an audible alert, a color change of the display, a highlighted signal from the device under test that violates the hysteresis loop mask, and a trigger signal.

The previously described versions of the disclosed subject matter have many advantages that were either described or would be apparent to a person of ordinary skill. Even so, these advantages or features are not required in all versions of the disclosed apparatus, systems, or methods.

Additionally, this written description makes reference to particular features. It is to be understood that the disclosure in this specification includes all possible combinations of those particular features. Where a particular feature is disclosed in the context of a particular aspect or example, that feature can also be used, to the extent possible, in the context of other aspects and examples.

Also, when reference is made in this application to a method having two or more defined steps or operations, the defined steps or operations can be carried out in any order or simultaneously, unless the context excludes those possibilities.

Although specific examples of the invention have been illustrated and described for purposes of illustration, it will be understood that various modifications may be made without departing from the spirit and scope of the invention. Accordingly, the invention should not be limited except as by the appended claims.

We claim:

1. A test and measurement instrument, comprising:
at least one port configured to receive a signal from a device under test;
a user interface configured to receive a user input indicating magnetic properties of a magnetic material of the device under test;
one or more processors configured to:
generate a hysteresis loop mask based on the user input magnetic properties of the magnetic material,
generate a plurality of hysteresis curves based on the signal received from the device under test;
determine whether the signal received from the device under test violates the hysteresis loop mask based on the plurality of hysteresis curves generated, and
generate an alert when the signal received from the device under test violates the hysteresis loop mask, the alert including identifying which portion of the signal received from the device under test violates the hysteresis loop mask; and
a display configured to display the hysteresis loop mask, the plurality of hysteresis curves overlapping, and the alert.

2. The test and measurement instrument of claim 1, wherein the hysteresis loop mask is generated based on the magnetic properties by receiving the magnetic properties of the magnetic material and selecting coordinates of the hysteresis loop mask that provide a selected test margin from the magnetic properties.

3. The test and measurement instrument of claim 2, wherein the selected test margin is 20% less than the magnetic properties.

4. The test and measurement instrument of claim 1, wherein the hysteresis loop mask includes a mask segment based on positive saturation values of flux density (Bs) and magnetic field strength (Hs), a positive remanence flux density (Br) value, and a positive coercive force (Hc) value.

5. The test and measurement instrument of claim 1, wherein the hysteresis loop mask includes a mask segment based on a positive remanence flux density (Br) value and a negative coercive force (−Hc) value.

6. The test and measurement instrument of claim 1, wherein the hysteresis loop mask includes a mask segment based on the negative coercive force (−Hc) value, negative saturation values of flux density (−Bs) and magnetic field strength (−Hs), and a negative remanence flux density (−Br) value.

7. The test and measurement instrument of claim 1, wherein the hysteresis loop mask includes a mask segment based on the negative remanence flux density (−Br) value and the positive coercive force (Hc) value.

8. The test and measurement instrument of claim 1, wherein the user interface is further configured to receive a user input indicating a type of magnetic material for the magnetic properties and the one or more processors are further configured to store the generated hysteresis loop mask as a default hysteresis loop mask for the type of magnetic material indicated by the user input.

9. The test and measurement instrument of claim 1, wherein the magnetic properties includes a type of magnetic material and the one or more processors generate the hysteresis loop mask by selecting a predetermined hysteresis loop mask stored in a memory that matches the type of magnetic material.

10. The test and measurement instrument of claim 1, wherein the alert is selected from the group consisting of a text alert, an audible alert, a color change of the display, and a highlighted signal from the device under test that violates the hysteresis loop mask.

11. The test and measurement instrument of claim 1, wherein the alert comprises a trigger signal.

12. A method for measuring a magnetic cord of a device under test, comprising:
receiving a signal from a device under test;
receiving an input indicating magnetic properties of a magnetic material of the device under test;
generating a hysteresis loop mask based on the magnetic properties of the magnetic material;
generating a plurality of hysteresis curves based on the signal received from the device under test;

determining whether the signal received from the device under test violates the hysteresis loop mask based on the plurality of hysteresis curves generated;

generating an alert when the signal received from the device under test violates the hysteresis loop mask, the alert including identifying which portion of the signal received from the device under test violates the hysteresis loop mask; and displaying on a display the hysteresis loop mask, the plurality of hysteresis curves overlapping, and the alert.

13. The method of claim 12, wherein generating the hysteresis loop mask based on the magnetic properties includes selecting coordinates of the hysteresis loop mask that are a predetermined percentage less than the magnetic properties.

14. The method of claim 13, wherein the predetermined percentage is 20%.

15. The method of claim 12, wherein the hysteresis loop mask is generated based on at least one of positive saturation values of flux density (Bs) and magnetic field strength (Hs), a positive remanence flux density (Br) value, a positive coercive force (Hc) value, a negative coercive force (−Hc) value, negative saturation values of flux density (−Bs) and magnetic field strength (−Hs), and a negative remanence flux density (−Br) value.

16. The method of claim 15, wherein the hysteresis loop mask includes four separate mask segments, the first mask segment based on positive saturation values Bs and Hs, the positive Br value, and the positive Hc value, the second mask segment based on the positive Br value and the negative −Hc value, the third mask segment based on the negative −Hc value, negative saturation values of −Bs and −Hs, and the negative −Br value, and the fourth mask segment based on the negative −Br value and the positive Hc value.

17. The method of claim 12, wherein the magnetic properties include a type of magnetic material, and the method further includes storing the generated hysteresis loop mask as a default hysteresis loop mask for the type of magnetic material indicated by the input.

18. The method of claim 12, wherein the magnetic properties includes a type of magnetic material, and generating the hysteresis loop mask includes selecting a predetermined hysteresis loop mask stored in a memory that matches the type of magnetic material.

19. The method of claim 12, wherein receiving an input indicating magnetic properties of a magnetic material of the device under test comprises receiving data from a software application that measures the magnetic properties of the magnetic material of the device under test.

20. The method of claim 12, wherein the alert is selected from the group consisting of a text alert, an audible alert, a color change of the display, a highlighted signal from the device under test that violates the hysteresis loop mask, and a trigger signal.

21. The test and measurement instrument of claim 1, further comprising at least a second port configured to receive a temperature signal correlated to the signal from the device under test, wherein the alert further includes identifying the corresponding temperature to the portion of the signal received from the device under test that violates the hysteresis loop mask.

* * * * *

UNITED STATES PATENT AND TRADEMARK OFFICE
CERTIFICATE OF CORRECTION

PATENT NO. : 10,895,612 B2  
APPLICATION NO. : 16/160879  
DATED : January 19, 2021  
INVENTOR(S) : U N Vasudev, Gajendra Kumar Patro and Krishna N H Sri Page 1 of 1

It is certified that error appears in the above-identified patent and that said Letters Patent is hereby corrected as shown below:

In the Specification

Column 8, Line 47, "cord" should read --core--;

In the Claims

Column 10, Line 59, Claim 12, Line 1, "cord" should read --core--.

Signed and Sealed this  
Sixth Day of April, 2021

Drew Hirshfeld  
*Performing the Functions and Duties of the*  
*Under Secretary of Commerce for Intellectual Property and*  
*Director of the United States Patent and Trademark Office*